United States Patent [19]

Trentesaux et al.

[11] Patent Number: 5,260,098
[45] Date of Patent: Nov. 9, 1993

[54] METHOD AND APPARATUS FOR TINNING TINNABLE AREAS ON AN ELECTRONIC COMPONENT PACKAGE

[75] Inventors: Thierry Trentesaux, Chaingy; Yves Martin, Ingre; Christian Daniel, Orleans, all of France

[73] Assignee: Alcatel Cit, Paris, France

[21] Appl. No.: 811,661

[22] Filed: Dec. 23, 1991

[30] Foreign Application Priority Data

Dec. 27, 1990 [FR] France ............... 90 16318

[51] Int. Cl.$^5$ ............... B05D 3/12; B05D 5/12
[52] U.S. Cl. ................... 427/347; 427/123; 427/346; 427/433; 118/57; 118/500; 118/501; 118/503
[58] Field of Search ............... 427/346, 347, 433, 123; 118/57, 500, 501, 503

[56] References Cited

U.S. PATENT DOCUMENTS

| | | | |
|---|---|---|---|
| 2,917,021 | 10/1956 | Barkstrom | 118/57 |
| 3,834,015 | 9/1974 | DiRenzo | 228/125 |
| 5,078,928 | 1/1992 | Balster et al. | 427/346 |

FOREIGN PATENT DOCUMENTS 2570220 3/1986 France .

OTHER PUBLICATIONS

Patent Abstracts of Japan, vol. 003, No. 109 (C-058) Sep. 12, 1979, & JP-A-54 089957 (Fujitsu Ltd.) Jul. 17, 1979.
Patent Abstracts of Japan, vol. 007, No. 182 (E-192) Aug. 11, 1983, & JP-A-58 086753 (Hitachi Seisakusho KK) May 24, 1983.
Patent Abstracts of Japan, vol. 012, No. 325 (M-737) Sep. 5, 1988, & JP-A-63 093468 (Fuji Electric Co. Ltd.) Apr. 23, 1988.

Primary Examiner—Shrive Beck
Assistant Examiner—David M. Maiorana
Attorney, Agent, or Firm—Sughrue, Mion, Zinn, Macpeak & Seas

[57] ABSTRACT

A method of tinning tinnable areas of an electronic component package, the method comprising a first step during which additional metal is applied in the liquid state to said tinnable areas, and a following step during which at least one cycle of oscillations about an equilibrium position is applied to the package while said metal thus applied is still in the liquid state, for the purpose of setting up successive and opposite displacements of masses of said metal along said areas in order to obtain a uniform distribution of said metal over said areas.

8 Claims, 5 Drawing Sheets

5,260,098

METHOD AND APPARATUS FOR TINNING TINNABLE AREAS ON AN ELECTRONIC COMPONENT PACKAGE

FIELD OF THE INVENTION

The present invention relates to a method and to apparatus for tinning tinnable areas of a package for an electronic component such as an integrated circuit, for example, for the purpose of surface mouting the component in a hybrid circuit.

BACKGROUND OF THE INVENTION

An integrated circuit package for surface mounting in a hybrid circuit has tinnable areas enabling it to be soldered to corresponding tinnable areas provided on the substrate of the hybrid circuit, where the tinning of said areas consists in adding metal thereto for the subsequent soldering operation. The added metal, commonly called "solder", is generally constituted by a eutectic tine-lead alloy.

As shown in FIG. 1, an integrated circuit package for surface mounting in a hybrid circuit thus includes tinnable areas such as 1 referred to herein as "connection" areas, which areas are situated at the periphery of the bottom face 2 of the package. The package is generally substantially rectangular in shape and of small thickness, and the areas constitute extensions over said bottom face of outside connection tabs as 3 which are otherwise accessible via the side faces of the package. These connections are connected to the chip of the integrated circuit by feedthroughs that terminate inside the package on connection tabs of said chip.

Some packages may also have a tinnable area such as 4 referred to herein as a "heat exchange" area and/or as a "mechanical fixing" area, for providing heat exchange between the integrated circuit and the outside and/or for providing mechanical fixing of the package to the hybrid circuit substrate.

As recalled in FIG. 1, the outside connection tabs are concave in shape where they extend the connection areas, thereby making it possible to establish reserves of solder that extend over the connection areas during the operation of tinning said areas, and making it possible in turn, after soldering to the substrate, to obtain fillets of solder which can be used, in particular, for visual inspection of the outside connections of the package.

Tinning the tinnable areas of an integrated circuit package generally comprises a first step during which a certain quantity of solder, generally a quantity greater than that required, is applied in the liquid state to said tinnable areas by techniques such as dipping, and a subsequent step during which the excess quantity of solder is removed while the solder is still in the liquid state.

Various methods are known for performing said subsequent step.

A first method consists merely in applying a manual jolt to the package. It will nevertheless be understood that this method is difficult for the operator to learn and is difficult to reproduce since it is not automated. In addition, this method does not make it possible to obtain uniform thickness of solder over all of the tinnable areas of the package, together with adequate filling of the reserves in the peripheral connections, since the amount of solder therein is a function of the orientation of the package when jolted.

A second method consists in tilting the package, e.g. by withdrawing the package from a solder bath tangentially to the surface thereof. This method also suffers from the drawback of not making it possible to obtain a uniform thickness of solder on the tinnable areas of the package, and of not adequately filling all of the reserves since filling of the reserves is a function of the orientation given to the package during said tilting operation.

A third method as described, for example, in French Pat. No. 2 570 220, consists in rotating the package as it leaves the bath about an axis perpendicular to its top or bottom faces so as to eliminate the excess quantity of solder by centrifuging. The main drawback of this method is that it is ill-suited to packages provided with both types of tinnable area mentioned above since it does not make it possible to obtain both a thin deposit on the central heat exchange and/or mechanical fixing area close to the axis of rotation and a sufficient quantity of solder in the peripheral reserves of the connection areas, where the effect of centrifugal force is at a maximu.

In order to avoid soldering defects appearing after the package has been soldered on the substrate of a hybrid circuit by remelting the solder applied in this way during the tinning operation, it is essential for the thickness of said solder on said tinnable areas of the package to be as thin and as uniform as possible and for the quantity of solder in said reserves to be sufficient, but only just sufficient.

SUMMARY OF THE INVENTION

An object of the present invention is to provide a tinning method includign an operation of distributing said solder over the tinnable areas so as to obtain a thickness of solder which is uniform over the tinnable areas while simultaneously obtaining a sufficent quantity of solder in the peripheral reserves.

The present invention provides a method of tinning tinnable areas of an electronic component package, the method comprising a first step during which additional metal is applied in the liquid state to said tinnable areas, the method being essentially characterized in that it includes a following step during which at least one cycle of oscillations about an equilibrium position is applied to the package while said metal thus applied is still in the liquid state, for the purpose of setting up successive and opposite displacements of masses of said metal along said areas in order to obtain a uniform distribution of said metal over said areas.

Another object of the present invention is to provide a tinning method in which said distribution operation is also determined so as to eliminate the excess quantity of added metal so as to obtain a thickness of solder which is both thin and uniform on the tinnable areas and which is just sufficient in the peripheral reserves.

The present invention thus provides a tinning method which is essentially characterized in that with the quantity of said metal applied being greater than the quantity necessary, the amplitude of the first oscillations of said cycle is determined so as to cause the excess quantity of metal to be eliminated.

Another object of the present invention is to provide apparatus for implementing the method in a manner that is automatic and thus accurately reproducible.

BRIEF DESCRIPTION OF THE DRAWINGS

Other objects and characteristics of the present invention appear on reading the following description of an embodiment, given with reference to the accompanying drawings in which, in addition to above-described FIG. 1 which recalls the various types of tinnable areas on an integrated circuit package.

DESCRIPTION OF THE PREFERRED EMBODIMENT

Figure 1:
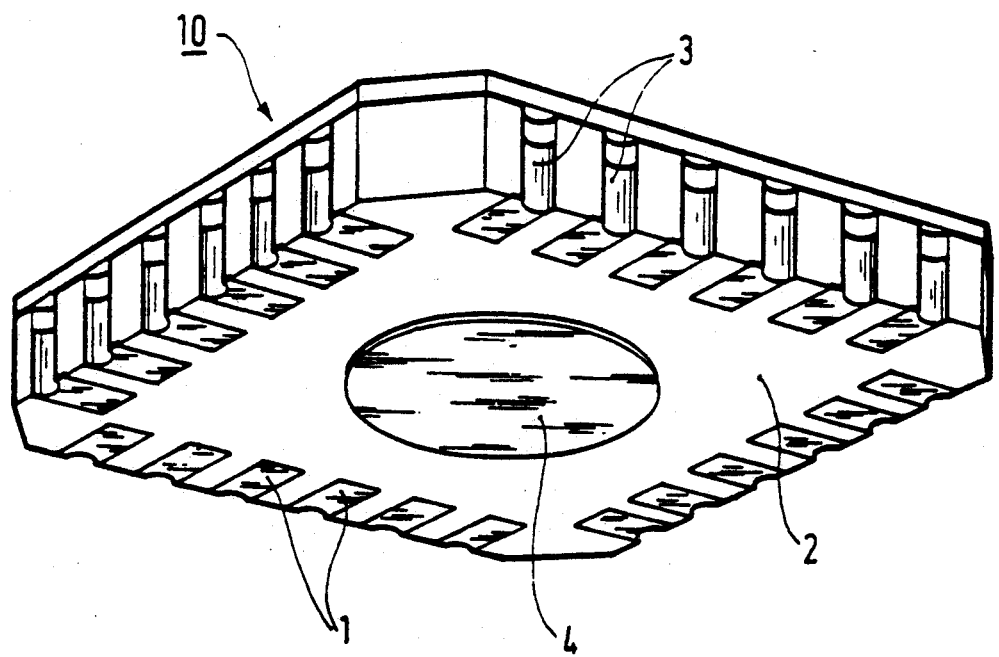
Figure 2:
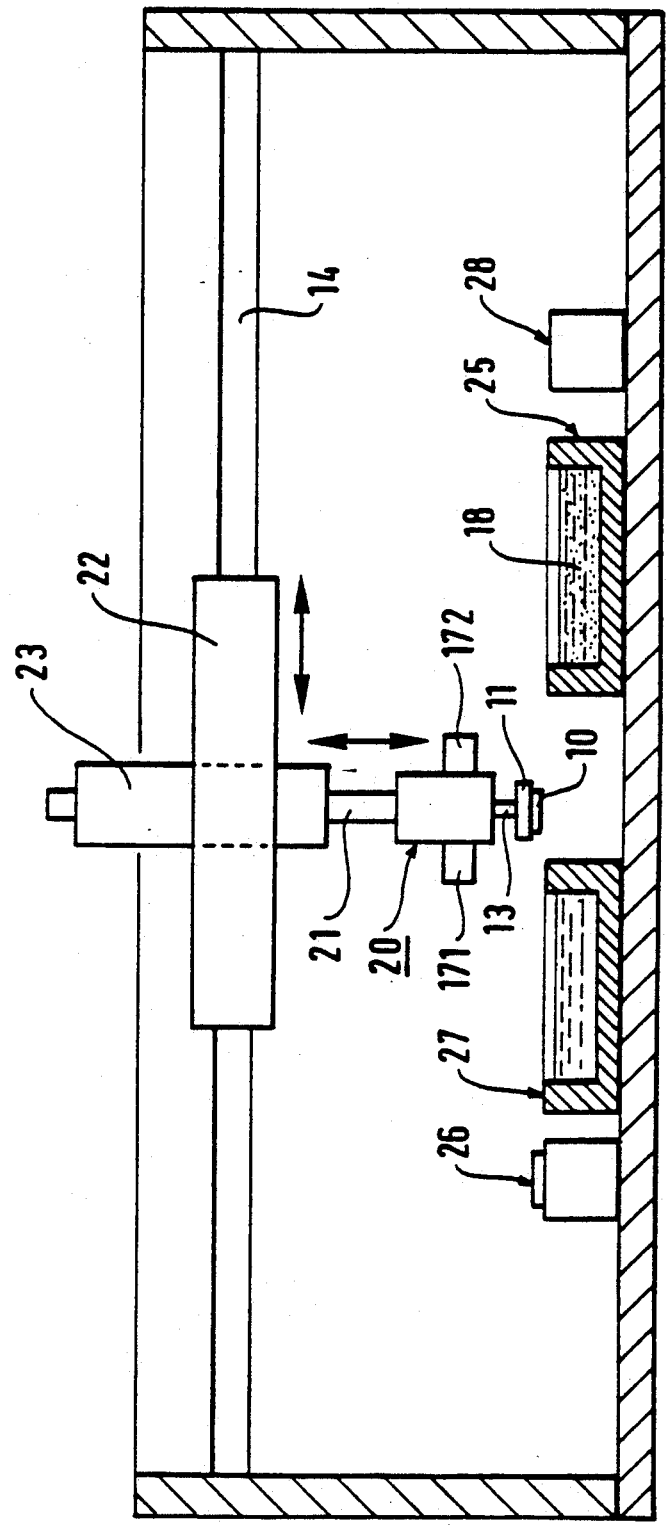
FIGS. 2 and 3 are diagrams showing possible apparatus for implementing the tinning method of the invention, with FIG. 2 being a simplified and diagrammatic overall view showing the general structure of the apparatus and with FIG. 3 being a more detailed view of the parts of the apparatus that perform more specifically said distribution and optionally said elimination.

FIG. 2 shows an integrated circuit package 10 which is held by a chuck 11 fixed on a bar 13 which is in turn supported by a "head" assembly 20 suitable, as described below, for acting on the bar 13 by means of two electromagnets 171 and 172 secured to said head, thereby acting on the chuck 11 and on the package 10 for performing said distribution and optionally said elimination, with the bar 13 being maintained by said head in a vertical equilibrium position apart from when acted on by the electromagnets. All of these components appear in greater detail in FIG. 3.

The head 20 is fixed to a horizontal support 14 by a vertical rod 21 which is movable in the horizontal and vertical directions as shown by arrows in FIG. 2 by means of carriages 22 and 23 for displacement in said directions and under the control of stepper motors.

This mobility of the head in the horizontal and vertical directions makes it possible not only to pick up the package from a station referenced 26, but also to transfer it through various different treatment stations including a fluxing station 27 and an unloading station 28 in addition to the tinning station 25 under consideration herein. The mobility of the head 20 in the vertical direction thus mades it possible to dip at least a portion of the package 10 not only in the fluxing bath but also, naturally, in the bath 18 of liquid alloy, and also to remove it therefrom.

Figure 3:
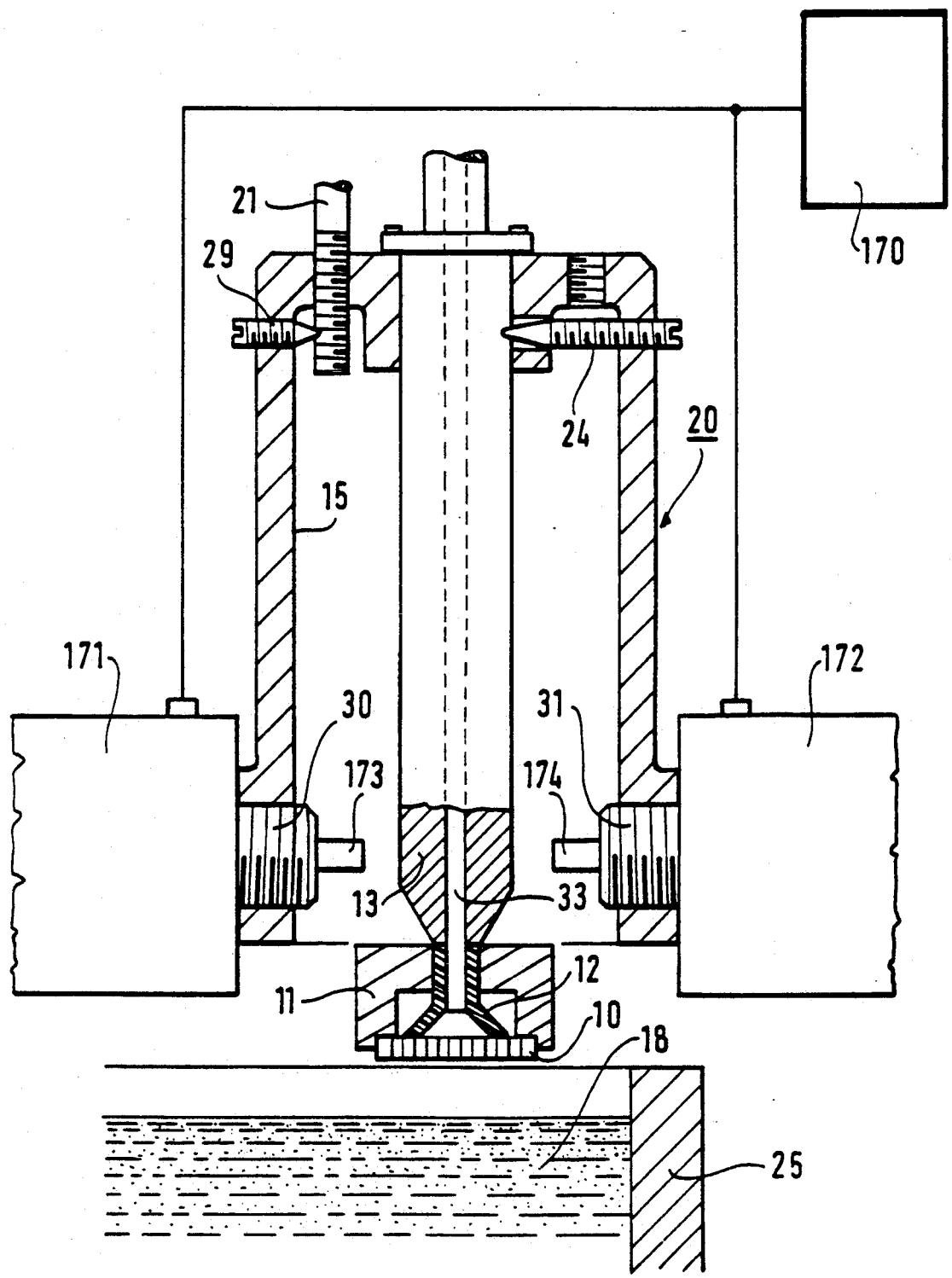

In FIG. 3 there can be seen the integrated circuit package 10 disposed horizontally with its bottom wall facing downwards in this case, the package being held in this position by the chuck 11 which grasps the top wall of the package in this case by means of a suction cup 12 disposed within the chuck and which applies suction to said to wall, the suction being provided by a vacuum pump (not shown) to which the suction cup 12 is connected by means of a duct 33 formed inside the bar 13. The chuck 11 is fixed to the bottom end of the bar 13.

The head 20 is in the form of a kind of hollow cylinder 15 designed to be secured at its horizontal top end to the top of the bar 13, and having two electromagnets 171 and 172 on its vertical wall, the magnets being preferably opposite each other, at the same height, and advantageously being identical, each having a moving core provided with a respective pusher 173, 174 disposed horizontally and suitable for striking the bar 13 when said electromagnets are appropriately powered by a power supply device 170 which in this case is common to both electromagnets.

The bar 13 is fixed to the horizontal top portion of the head 20 by locking means, e.g. screws, shown diagrammatically at 24 in FIG. 3.

Likewise, the rod 21 is fixed to the top portion of the head 20 by locking means, e.g. screws, shown diagrammatically at 29 in FIG. 3.

The electromagnets 171 and 172 are fixed to the vertical wall of the head 20 by respective assembly means each constituted by a kind of threaded barrel 30, 31 through which the pushers slide, and which co-operate in corresponding holes formed through said wall by being screwed therein.

It will be observed that it is advantageous to provide an electrode for detecting the level of the alloy bath and a wiper for cleaning the surface of the bath, which members (not shown) are advantageously fixed to the bottom portion of the vertical wall of the head 20.

Figure 4:
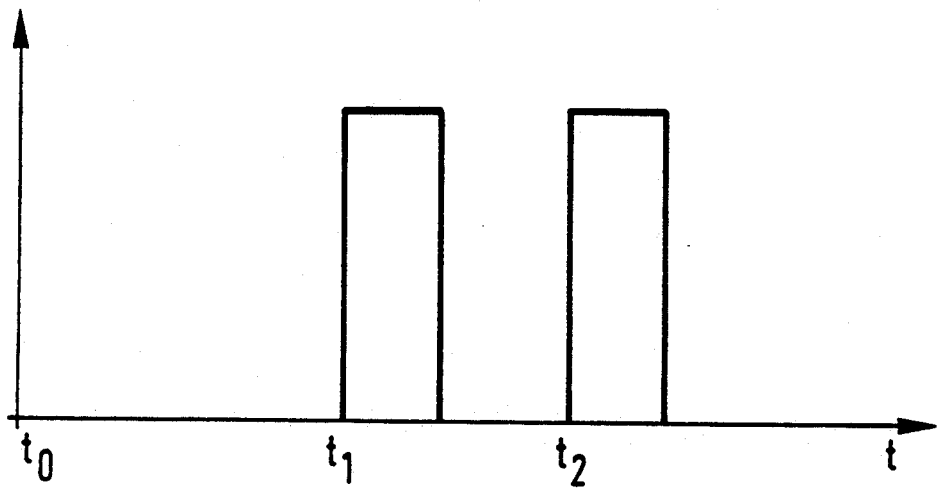
FIGS. 4 and 5 are graphs respectively showing the shape of pulses fed to the electromagnets in apparatus as shown in FIGS. 2 and 3, and the corresponding waveform of the damped oscillation cycles to which the package is subjected.
Figure 5:
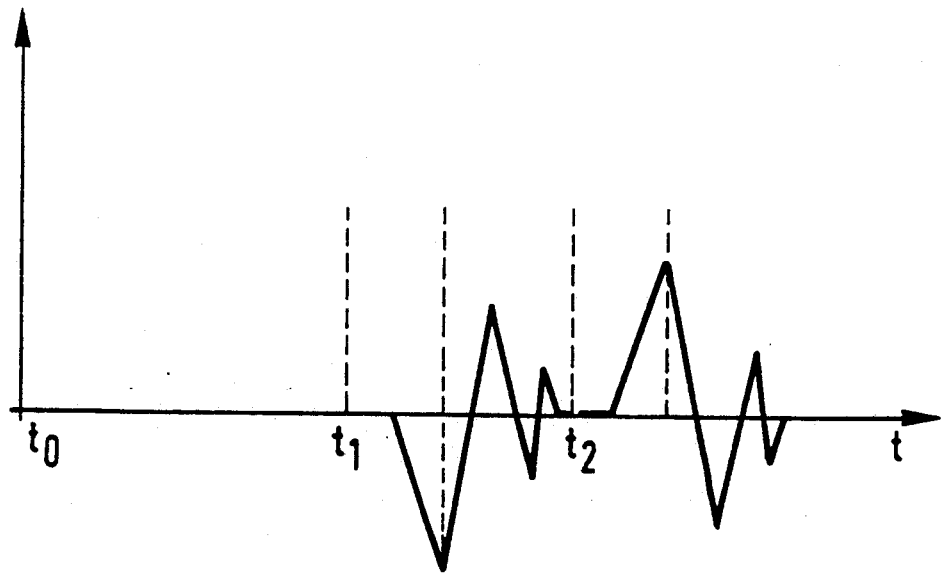

One of the electromagnets, e.g. the electromagnet 171, is powered with a pulse signal $I_1$ as shown in FIG. 4, and at a given instant $t_1$ following the instant $t_0$ at which the package 10 is removed from the bath of liquid alloy. The pusher 173 of the moving core of said electromagnet then strikes the bar 13 which is advantageously made of a material such as polyurethane enabling the shock to be damped and to be retransmitted as damped to the chuck 11 and thus to the package 10 which is then subjected to a cycle of damped oscillations about its vertical equilibrium position as shown in FIG. 5.

In addition to the material from which the bar 13 is made, contributions to the damping are also provided by the rigid fixing of the bar 13 to the head 20 and by the weight of the assembly constituted by the bar 13, the chuck 11, and the suction cup 12. The amplitude of the first oscillations in this cycle of damped oscillations, and in particular the amplitude of the very first oscillation, can thus be made large enough to cause the excess quantity of liquid alloy to be eliminated.

Should such elimination not be necessary, or should it be obtained in some other manner, then there is no need to provide so much damping and the cycle of oscillations applied to the package would then serve simply to obtain uniform distribution of the alloy over the tinnable areas and a sufficient quantity of the alloy in the peripheral reserve merely by succcessive and oppositely-directed displacements of the masses of liquid alloy along said areas.

To obtain more uniform distribution, particularly when a cycle of damped oscillations is applied to the package as mentioned above, it is advantageous to apply a subsequent second cycle of damped oscillations by powering the other electromagnet (the electromagnet 172) with a pulse $I_2$ at an instant $t_2$ after the package has returned to its equilibrium position, the amplitude of the pulse $I_2$ advantageously be identical to that of the pulse $I_1$ as previously applied to the electromagnet 171. The pulse $I_2$ is also shown in FIG. 4, and the corresponding cycle of damped oscillations is shown in FIG. 5, with FIG. 5 clearly showing that the masses of alloy are displaced along the tinnable areas through successive and opposite displacements (that are exactly opposite when the pulses $I_1$ and $I_2$ are of identical amplitudes) for oscillations having the same positions within each of the two cycles.

The amplitude of the first oscillation in each of the two cycles is then determined so as to avoid eliminating more than the excess quantity of alloy. Depending on the type of application envisaged, a plurality of pairs of such cycles of damped oscillations may thus be applied in succession to the package.

Parameters such as the amplitudes of the electromagnet control pulses, the durations thereof, the instants at which they appear relative to one another and also relative to the instant $T_0$ of extraction from the bath are all determined as a function of the type of application envisaged, and in particular as a function of the type of package used and of the type of alloy used.

After application of the oscillation cycle(s), the chuck remains above the bath so as to maintain a certain temperature level prior to cooling.

Figure 6:
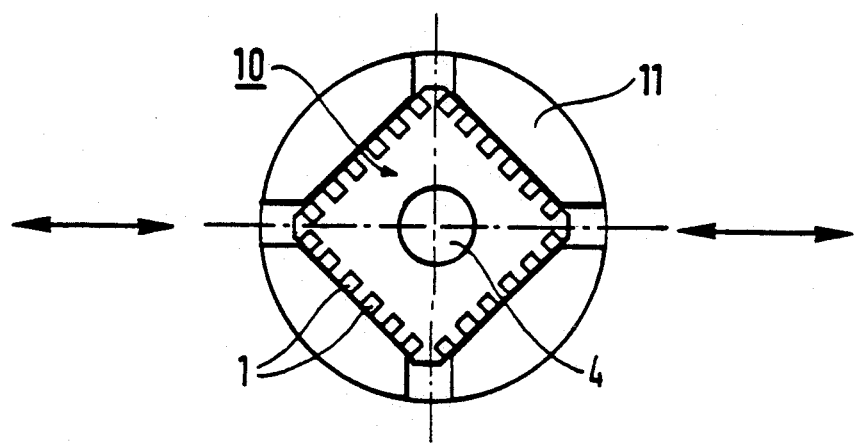
FIG. 6 is a view from below (relative to the views of FIGS. 2 and 3) showing an advantageous disposition of the package relative to the displacement directio of the moving cores of the electromagnets.

As shown in FIG. 6, the package 10 is advantageously held by the chuck 11 in an orientation such that the shocks received by a package that is substnatially rectangular in shape are applied along one of the diagonals of said rectangle, which makes it possible, by symmetry, to obtain more uniform distribution of metal within the tinnable areas.

It will be observed that since the amplitude of package displacement during said oscillations and thus the amplitude of the resulting displacements of the masses of matel alloy along the tinnable alloys of the package are extremely small in practice, the package remains in a horizontal position during said oscillations such that said elimination operation does not interfere with said distribution operation, and vice versa.

The electromagnats of the apparatus of the invention may also advantegeously be used during the earlier dipping operation to ensure that the package engages the surface of the bath without imprisoning a bubble of air between the package and said surface.

Figure 7:
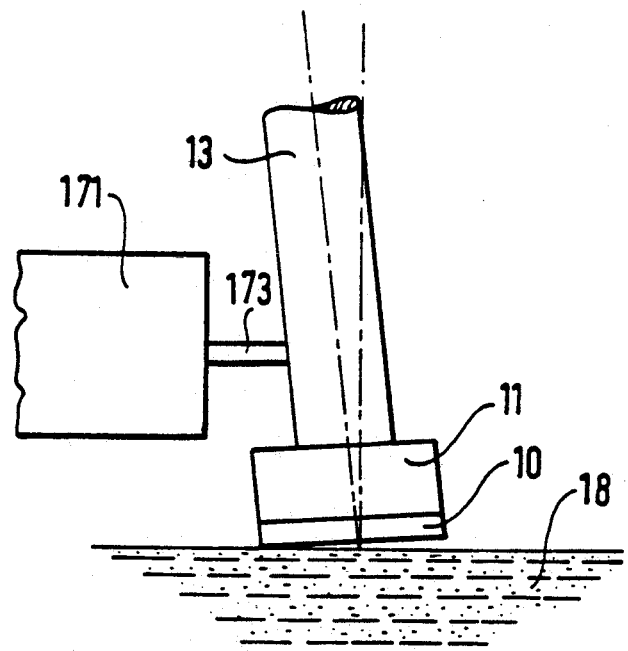
FIG. 7 is a simplified view showing a special use of the component shown in FIG. 3 for performing the dipping operation whereby the added metal is applied to the tinnable areas.

This is simply achieved by exciting one of the electromagnets continously, e.g. the electromagnet 171 as shown in FIG. 7, thereby imparting a small amount of tilt to the package relative to the horizontal surface of the bath at the instant it engages it.

The package is then brought back to the horizontal position by ceasing to excite said electromagnet.

We claim:

1. In a method of tinning tinnable areas on a face of a horizontal bottom wall of a horizontally disposed electronic component package comprising: applying in a first step additional metal in the liquid state to said tinnable areas, the improvement comprising: applying in a following step, at least one cycle of oscillations horizontally about an equilibrium position to the package with the face of the package bottom wall covered by said tinnable areas facing downwards while said metal previously applied is still in the liquid state to set up successive and opposite direction, horizontal displacements of masses of said metal along said tinnable areas in order to remove excess metal and to obtain a uniform, thin distribution of said metal over said tinnable areas.

2. A method according to claim 1, wherein, in the first step, a quantity of said metal is applied which is greaterthan the quantity necessary, and, in the following step, the amplitude of the first oscillation of said cycle is controlled to cause the excess quantity of metal to be eliminated.

3. A method according to claim 1, wherein said following step comprises applying from opposite horizontal directions, at least one pair of two damped oscillation cycles in sequence to the package and establishing opposite displacements for oscillations having the same positions within the cycles of said pair.

4. A method according to claim 3, further comprising separating the two cycles of said pair by a period that is not less than the time required to return the package to said equilibrium position.

5. A method according to claim 1, wherein said package is substantially rectangular in shape having plural diagonals, and said method comprises applying the oscillation cycle(s) along one of the diagonals of said rectangular package.

6. In a method of tinning tinnable areas of an electronic component package comprising: applying in a first step additional metal in the liquid state to said tinnable area, the improvement comprising: applying in a following step at least one cycle of oscillations horizontally about an equilibrium position to the package while said metal previously applied is still in the liquid state to set up successive and opposite direction, horizontal displacements of masses of said metal along said tinnable area, wherein an electromagnet is mounted with a moving core thereof fitted with a horizontal pusher for striking a vertical bar having a top end thereof fixed to a horizontal top portion of a head assmebly (20) and a bottom end provided with means for holding the package (10) in a horizontal position, and said method further includes the step of continously exciting said electromagnet to tilt the package relative to the surface of the bath at the moment that said package comes into contact with the surface of the bath to ensure that the package engages the surface of the bath without imprisoning a bubble of air between the package and said surface.

7. In a method of tinning tinnable areas on a face of a horizontal bottom wall of a horizontally disposed electronic component package comprising: applying in a first step additional metal in the liquid state to said tinnable areas, the improvement comprising: applying in a following step at least one pair of two damped oscillation cycles in sequence to the package from opposite horizontal directions and establishing opposite displacements for oscillations having the same positions within the cycles of said pair, horizontally about an equilibrium position to said package, with the face of the package bottom wall covered by said tinnable areas facing downwards while said metal previously applied is still in the liquid state to set up successive and opposite direction horizontal displacements of masses of said metal along said tinnable areas in order to remove excess metal and to obtain a uniform, thin distribution of said metal over said tinnable areas, wherein a pair of electromagnets are each mounted with a moving core thereof fitted with a horizontal pusher to respective opposite sides of a vertical bar, for striking said vertical bar from opposite sides, said vertical bar having a top end thereof fixed to a horizontal top portion of a head assembly (20) and a bottom end provided with means for holding the package (10) in a horizontal position, and whereby said step of applying from opposite horizontal directions at least one pair of two damped oscillaiton cycles in sequence comprises energizing said electromagnets in sequence and thereby striking said vertical bar from opposite sides by respective horizontal pushers, thereby establishing opposite displacements for oscillations having the same positions within the cycles of said pair.

8. A method according to claim 7, further comprising separating the two cycles of said pair by a period that is not less than the time required to return the package to said equilibrium position.

* * * * *